United States Patent
Cabral, Jr. et al.

(10) Patent No.: US 6,524,908 B2
(45) Date of Patent: Feb. 25, 2003

(54) METHOD FOR FORMING REFRACTORY METAL-SILICON-NITROGEN CAPACITORS AND STRUCTURES FORMED

(75) Inventors: Cyril Cabral, Jr., Ossining, NY (US); Lawrence Clevenger, LaGrangeville, NY (US); Louis Hsu, Fishkill, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/872,603

(22) Filed: Jun. 1, 2001

(65) Prior Publication Data

US 2002/0185689 A1 Dec. 12, 2002

(51) Int. Cl.⁷ .......................................... H01L 21/8242
(52) U.S. Cl. .................. 438/254; 438/253; 438/239; 438/250; 438/397; 438/396
(58) Field of Search ................................ 438/239–242, 438/250–257, 393–399

(56) References Cited

U.S. PATENT DOCUMENTS

| | | | | | |
|---|---|---|---|---|---|
| 5,786,259 | A | * | 7/1998 | Kang ........................... | 438/396 |
| 5,998,250 | A | * | 12/1999 | Andricacos et al. ........ | 438/240 |
| 6,025,632 | A | * | 2/2000 | Fukuda et al. .............. | 257/363 |
| 6,096,597 | A | * | 8/2000 | Tsu et al. .................... | 438/240 |
| 6,184,073 | B1 | * | 2/2001 | Lage et al. .................. | 438/238 |
| 6,294,420 | B1 | * | 9/2001 | Tsu et al. .................... | 438/239 |
| 2001/0029068 | A1 | * | 10/2001 | Chittipeddi et al. ........ | 438/142 |
| 2001/0034106 | A1 | * | 10/2001 | Moise et al. ................ | 438/396 |
| 2001/0040271 | A1 | * | 11/2001 | Duncombe et al. ......... | 257/532 |
| 2002/0004278 | A1 | * | 1/2002 | Gutsche ....................... | 438/396 |
| 2002/0006708 | A1 | * | 1/2002 | Kang et al. ................. | 438/399 |
| 2002/0130367 | A1 | * | 9/2002 | Cabral, Jr. et al. .......... | 257/368 |

FOREIGN PATENT DOCUMENTS

JP    2000200877 A  *  7/2000  ........... H01L/27/04

* cited by examiner

Primary Examiner—John F. Niebling
Assistant Examiner—Jennifer M. Kennedy
(74) Attorney, Agent, or Firm—Robert M. Trepp; Randy W. Tung

(57) ABSTRACT

A method for forming a refractory metal-silicon-nitrogen capacitor in a semiconductor structure and the structure formed are described. In the method, a pre-processed semiconductor substrate is first positioned in a sputtering chamber. Ar gas is then flown into the sputtering chamber to sputter deposit a first refractory metal-silicon-nitrogen layer on the substrate from a refractory metal silicide target, or from two targets of a refractory metal and a silicon. $N_2$ gas is then flown into the sputtering chamber until that the concentration of $N_2$ gas in the chamber is at least 35% to sputter deposit a second refractory metal-silicon-nitrogen layer on top of the first refractory metal-silicon-nitrogen layer. The $N_2$ gas flow is then stopped to sputter deposit a third refractory metal-silicon-nitrogen layer on top of the second refractory metal-silicon-nitrogen layer. The multilayer stack of the refractory metal-silicon-nitrogen is then photolithographically formed into a capacitor.

11 Claims, 1 Drawing Sheet

METHOD FOR FORMING REFRACTORY METAL-SILICON-NITROGEN CAPACITORS AND STRUCTURES FORMED

CROSS-REFERENCE TO RELATED APPLICATION

This application is cross-referenced to Ser. No. 09/760,245, filed Jan. 12, 2001, which is directed to a semiconductor device incorporating elements of refractory metal-silicon-nitrogen and method for fabrication.

FIELD OF THE INVENTION

The present invention generally relates to a method for fabricating semiconductor devices incorporating capacitor elements formed of refractory metal-silicon-nitrogen and devices formed and more particularly, relates to a method for fabricating semiconductor devices that incorporates capacitor elements formed by depositing multi-layers of refractory metal-silicon-nitrogen in the same process chamber by varying processing conditions and devices formed by such fabrication.

BACKGROUND OF THE INVENTION

In semiconductor fabrication, capacitors are frequently formed in-situ in a semiconductor structure. For instance, an in-situ formed capacitor can be found in a dynamic random access memory device. The process required for forming the capacitor is complicated. It involves the deposition of different layers of materials by different chemical processes, and most likely, in different process chambers. For instance, layers deposited of a polysilicon material are frequently used as the electrode, while layers deposited of an insulating material such as silicon oxide are frequently used as the capacitor dielectric. The process therefore requires multiple number of depositions, from multiple number of different materials conducted in multiple number of process chambers for the forming and patterning of the capacitor.

In modern semiconductor devices, refractory metals have been frequently used in semiconductor processes to form vias or contacts. However, refractory metal-nitrogen alloys have not been used widely in the processing of semiconductor devices. For instance, only recently, U.S. Pat. No. 5,892,281 describes the use of tantalum-aluminum-nitrogen alloys in semiconductor devices as a diffusion barrier and an adhesion promoter. The patent discloses the use of Ta—Al—N in a semiconductor device to prevent inter-diffusion between surrounding layers, for instance, between two conductor layers; between a semiconductor layer and a conductor layer; between an insulator layer and a conductor layer; between an insulator layer and a semiconductor layer; or between two semiconductor layers. A second use of Ta—Al—N is to promote adhesion with adjacent layers, for instance, between two conductor layers; between a conductor layer and an insulator layer; between a semiconductor layer and a conductor layer; or between two semiconductor layers. However, U.S. Pat. No. 5,892,281 does not teach any other uses for tantalum-aluminum-nitrogen alloys in conductor fabrication.

It is therefore an object of the present invention to provide a method for forming a capacitor in-situ in a semiconductor structure that does not have the drawbacks or the shortcomings of the conventional methods.

It is another object of the present invention to provide a method for forming a capacitor in-situ in a semiconductor structure that requires only the deposition of a single material.

It is a further object of the present invention to provide a method for forming a capacitor in-situ in a semiconductor structure that requires only the deposition of a single material of refractory metal-silicon-nitrogen in multiple layers.

It is another further object of the present invention to provide a method for forming a capacitor in a semiconductor structure that requires only the deposition of a single material of TaSiN in multiple layers under different processing conditions.

It is still another object of the present invention to provide a method for forming a capacitor in a semiconductor structure by depositing multiple layers of a refractory metal-silicon-nitrogen each having a different stoichiometry.

It is yet another object of the present invention to provide a method for forming a capacitor in-situ in a semiconductor structure by depositing multiple layers of a refractory metal-silicon-nitrogen each having a different sheet resistance value.

It is still another further object of the present invention to provide a method for forming a capacitor in a semiconductor structure by depositing multiple layers of refractory metal-silicon-nitrogen in the same chamber by varying a flow rate of partial pressure of nitrogen into the chamber.

It is yet another further object of the present invention to provide a semiconductor capacitor structure which has a lower electrode, a middle dielectric layer and an upper electrode formed of the same refractory metal-silicon-nitrogen material but with different stoichiometry.

SUMMARY OF THE INVENTION

In accordance with the present invention, a method for forming a refractory metal-silicon-nitrogen capacitor in a semiconductor structure and the structure formed are disclosed.

In a preferred embodiment, a method for forming a refractory metal-silicon-nitrogen capacitor in a semiconductor structure can be carried out by the operating steps of positioning a preprocessed semiconductor substrate in a sputtering chamber; flowing Ar gas into the sputtering chamber; sputter depositing a first refractory metal-silicon-nitrogen layer on the substrate from a refractory metal silicide target, or from targets of a refractory metal and a silicon; flowing $N_2$ gas into the sputtering chamber such that concentration of the $N_2$ gas in the chamber is at least 35% by adjusting the flow rate or partial pressure of $N_2$; sputter depositing a second refractory metal-silicon-nitrogen layer on top of the first refractory metal-silicon nitrogen layer; stopping the $N_2$ gas flow into the sputtering chamber; sputter depositing a third refractory metal-silicon-nitrogen layer on top of the second refractory metal-silicon-nitrogen layer; and photolithographically forming the first, second and third refractory metal-silicon-nitrogen layers into a capacitor.

The method for forming a refractory metal-silicon-nitrogen capacitor in a semiconductor structure may further include the step of in-situ annealing the capacitor at a temperature of at least 80° C., or the step of flowing Ar gas into the sputtering chamber at a flow rate between about 10 sccm and about 200 sccm, or the step of flowing $N_2$ gas into the sputtering chamber at a flow rate between about 1 sccm and about 100 sccm. The method may further include the step of sputter depositing the first and the third refractory metal-silicon-nitrogen layer to a thickness between about 100 Å and about 5000 Å, or the step of depositing the second refractory metal-silicon-nitrogen layer to a thickness between about 100 Å and about 5000 Å. The method may further include the step of sputter depositing the first and the third refractory metal-silicon-nitrogen layer each having a sheet resistance of not higher than 50 ohm/sq., or the step of sputter depositing the second refractory metal-silicon-nitrogen layer which has a dielectric constant greater than 7.5. The method may further include the step of sputter depositing the first, second and third refractory metal-silicon-nitrogen layer formed of a refractory metal selected from the group consisting of Ta, Nb, V, W and Ti.

The present invention is further directed to a semiconductor capacitor structure which includes a lower electrode formed of a first refractory metal-silicon-nitrogen material that has a sheet resistance not higher than 50 ohm/sq; a middle dielectric layer formed of a second refractory metal-silicon-nitrogen material that has a dielectric constant greater than 7.5; and an upper electrode formed of the first refractory metal-silicon-nitrogen material.

In the semiconductor structure of a capacitor, each of the lower electrode and upper electrode is formed to a thickness between about 100 Å and about 5000 Å, the middle dielectric layer is formed to a thickness between about 100 Å and about 5000 Å. The refractory metal in the first, second and third refractory metal-silicon-nitrogen material is selected from the group consisting of Ta, Nb, V, W and Ti. The first refractory metal-silicon-nitrogen material has a sheet resistance of not higher than 50 ohm/sq., while the second refractory metal-silicon-nitrogen material has a dielectric constant greater than 7.5.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming a refractory metal-silicon-nitrogen capacitor in a semiconductor structure by the in-situ forming of multiple refractory metal-silicon-nitrogen layers each having a different stoichiometry on a semiconductor substrate and then, photolithographically forming the multiple layers into a capacitor.

In the method, a preprocessed semiconductor substrate is first positioned in a sputtering chamber, Ar gas is then flown into the sputtering chamber to sputter deposit a first refractory metal-silicon-nitrogen layer on the substrate from either a single refractory metal silicide target or from two targets of a refractory metal and silicon. $N_2$ gas is then flown into the sputtering chamber until the concentration of the $N_2$ gas in the chamber reaches at least 35% by volume by adjusting the flow or partial pressure of $N_2$, a second refractory metal-silicon-nitrogen layer is then sputter deposited on top of the first refractory metal-silicon-nitrogen layer. The $N_2$ gas flow is then stopped to deposit a third refractory metal-silicon-nitrogen layer on top of the second refractory metal-silicon-nitrogen layer. After the deposition of all three refractory metal-silicon-nitrogen layers, the layers are photolithographically formed into a capacitor.

The present invention novel method may be followed by an optional annealing step, wherein the capacitor structure is in-situ annealed at a temperature of at least 80° C., and preferably at a temperature of at least 100° C. In the preferred embodiment, the Ar gas flows into the sputtering chamber at a flow rate between about 10 sccm and about 200 sccm. The $N_2$ gas flows into the sputtering chamber during the formation of the middle refractory metal-silicon-nitrogen layer of high sheet resistance at a flow rate between about 1 sccm and about 100 sccm.

The invention further discloses a semiconductor structure of a capacitor that is constructed by a lower electrode, a middle dielectric layer and an upper electrode. The lower electrode and the upper electrode are both formed of a first refractory metal-silicon-nitrogen material that has a sheet resistance not higher than 50 ohm/sq., while the middle dielectric layer is formed of a second refractory metal-silicon-nitrogen material that has a dielectric constant greater than 7.5. Each of the lower and upper electrodes and the middle dielectric layer is formed to a thickness between about 100 Å and about 5000 Å. The refractory metal in the first, the second and the third refractory metal-silicon-nitrogen materials may be selected from the group consisting of Ta, Nb, V, W and Ti.

Figure 1:
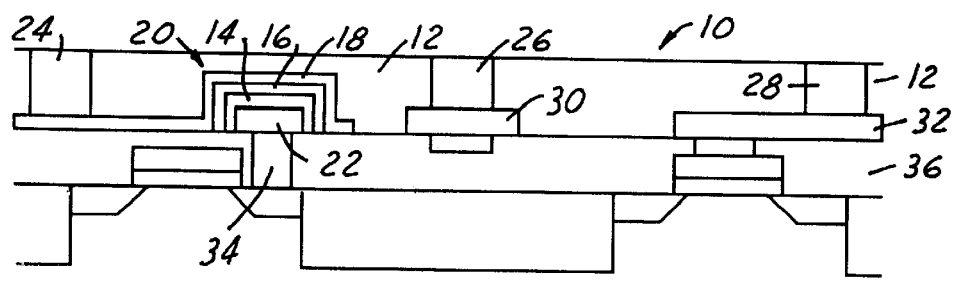
FIG. 1 is an enlarged, cross-sectional view of a semiconductor structure that includes the present invention capacitor formed of three layers of a refractory metal-silicon-nitrogen material.

Referring initially to FIG. 1, wherein an enlarged, cross-sectional view of the present invention CMOS structure 10 with a capacitor stack 20 and an insulating material layer 12 formed on top is shown. A lower electrode layer 14, a dielectric layer 16 and an upper electrode layer 18 are deposited of refractory metal-silicon-nitrogen materials that have different stoichiometry and patterned over the diffusion barrier 22. The insulating material layer 12 is deposited over the entire wafer and contact openings 24,26 and 28 are etched which are latter filled with a conductive material for forming electrical contacts to the diffusion barrier 22, the fuse 30 and the resistor 32, respectively. In the particular structure 10, shown in FIG. 1, the diffusion barrier 22 prevents reaction between the lower electrode 14 and the polysilicon contact via 34. The fuse 30 can be blown by forcing a large current through the line-fuse material-via structure causing excessive heating and melting in the fuse material and thus, loss of electrical conductivity.

A refractory metal-silicon-nitrogen material such as TaSiN has wide range of electrical resistivities depending on the stoichiometry of the TaSiN film. For instance, under normal DC sputtering conditions, films ranging from 0.2 ohm-cm to nearly $10^6$ ohm-cm can be obtained by varying the nitrogen to argon ratio, i.e. from 4 vol. % to 50 vol. % by adjusting flow rate or partial pressure of nitrogen. At higher nitrogen ratios, the film becomes insulating. The rate of increase in electrical resistance with nitrogen flow is monotonic, but the increases are much steeper at the higher nitrogen flow ratios.

Table 1 shows data on the relationship between the sheet resistance of TaSiN films and the nitrogen percentage in the argon sputtering plasma. The materials listed in Table 1 were deposited in deposition system #1 by adjusting the flow of $N_2$ into the Ar sputtering plasma. The forty-nine point resistance measurement indicates that film non-uniformity increases as sheet resistance increases with greater amounts of nitrogen in the sputtering plasma. For example, a significant uniformity degradation occurs when nitrogen content increases from 40 to 44, which is accompanied by a sheet resistance increases of an order of magnitude.

TABLE 1

| $N_2$ in Ar Sputtering Plasma (vol. %) | Rs (Ohm/sq) | Uniformity (49 points, %) |
|---|---|---|
| 4 | 25.78 | 4.4 |
| 7 | 28.6 | 4.7 |
| 10 | 35.6 | 4.9 |
| 13 | 43.3 | 4.9 |
| 16 | 52.91 | 4.7 |
| 20 | 71.52 | 4.5 |
| 24 | 100.73 | 4.3 |
| 28 | 151.47 | 4.4 |
| 32 | 255.5 | 5.8 |
| 36 | 528.3 | 9.2 |
| 40 | 1727 | 17.2 |
| 44 | 14663 | 29.8 |
| 48 | 657770 | 44.3 |

Tables 2 and 3 show electrical properties for two TaSiN compositions which are insulators and can be used as a dielectric for a capacitor application. The materials listed in Tables 2 and 3 were deposited in deposition system #2 by adjusting the partial pressure of $N_2$ into the Ar sputtering plasma. The capacitance, dissipation factor and dielectric constant are shown as a function of applied frequency. For both films, the dissipation factor increased with increasing frequency whereas the dielectric constant is slightly lower at higher frequencies primarily due to the higher loss (dissipation factor). The error in the measurements is within ±10%.

TABLE 2

| 75.5 nm Ta:Si:N | 7.7:30.7:61.6 (50% $N_2$ in Ar) | | |
|---|---|---|---|
| Frequency (hz) | Capacitance (pF) | Dissipation Factor | Dielectric Constant |
| 10 k | 249 pF | 0.020 | 9.5 |
| 40 k | 242 pF | 0.021 | 9.2 |
| 100 k | 238 pF | 0.029 | 9.1 |

TABLE 3

| 58.7 nm Ta:Si:N | 9.8:30.2:59.9 (30% $N_2$ in Ar) | | |
|---|---|---|---|
| Frequency (hz) | Capacitance (pF) | Dissipation Factor | Dielectric Constant |
| 10 k | 282 pF | 0.010 | 8.4 |
| 40 k | 274 pF | 0.034 | 8.1 |
| 100 k | 267 pF | 0.050 | 7.9 |

As shown in Tables 2 and 3, the first sample in Table 2 has a composition of Ta:Si:N of 7.7:30.7:61.5 and was prepared with 50 vol. % nitrogen in Ar plasma. The second sample shown in Table 3 has a composition of 9.8:30.2:59.9 and was prepared with 30% nitrogen in Ar plasma. The dielectric constant for the materials is shown as a function of frequency by using a C-V measurement technique. The dielectric constant decreases slightly with frequency due to the increase in the dissipation factor. The dielectric constant of the present invention TaSiN is between about 8.0 and about 9.5.

Figure 2:
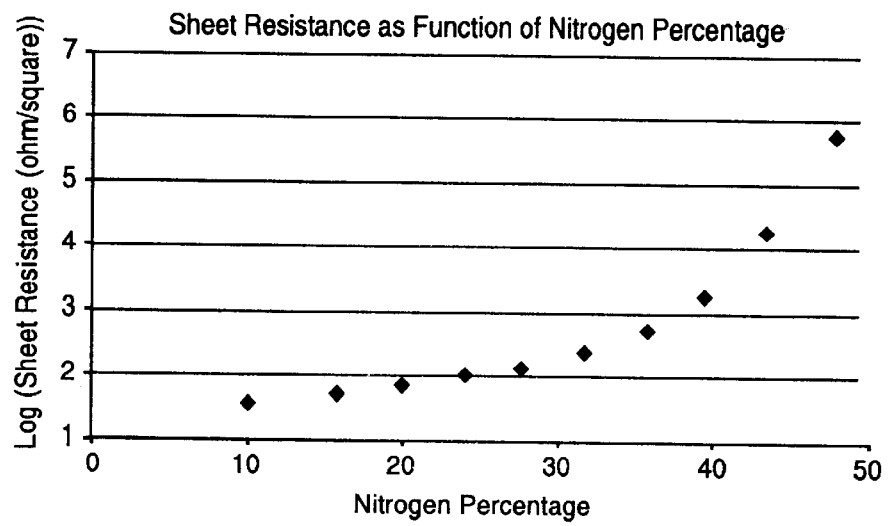
FIG. 2 is a graph illustrating data obtained in deposition system #1 showing the dependence of the sheet resistance of the present invention refractory metal-silicon-nitrogen material on the nitrogen content by adjusting nitrogen gas.
Figure 3:
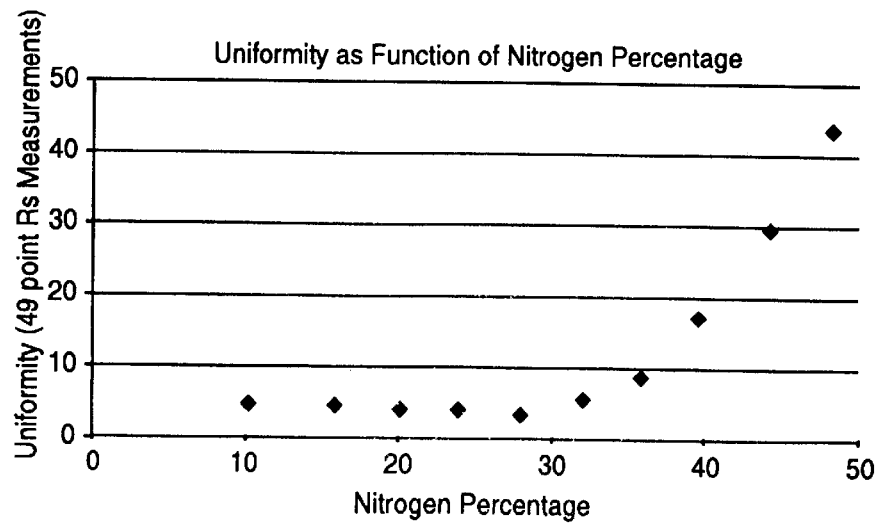
FIG. 3 is a graph illustrating data obtained in deposition system #1 showing the dependence of the film uniformity of the present invention refractory metal-silicon-nitrogen material on the nitrogen content by adjusting nitrogen flow.

Referring now to FIG. 2, wherein a graph plotted of sheet resistance of the TaSiN films as a function of nitrogen in the sputtering plasma is shown. FIG. 3 shows a graph plotted of resistance uniformity also as a function of nitrogen in the sputtering plasma. The uniformity degrades with higher percentages of $N_2$ in the Ar sputtering plasma.

The present invention novel method uses a multi-layer structure of TaSiN, each with a different composition to achieve a final material resistance. By utilizing the novel method, the process window for the fabrication process can be greatly increased. For example, it is possible to obtain sheet resistance values between 15 K-ohm/square to insulate with a better uniformity control.

Another benefit made possible by the present invention novel method is the possibility for depositing multi-layer films in-situ to fabricate a capacitor. For example, first deposit a low sheet resistance film to a predetermined thickness as the bottom electrode, then deposit from the same target but with a higher nitrogen flow to form a dielectric film, and finally deposit the third low sheet resistance film as the top electrode. The present invention novel method may optionally include an in-situ annealing step such that the sandwiched film is ready for capacitor patterning. This allows a reduction in the fabrication cost and therefore, made the present invention method not only suitable for semiconductor front-end applications, such as integration with devices, but also suitable for implementing high-density capacitors at the packaging level.

The present invention novel capacitor may be formed by a refractory metal-silicon-nitrogen material such as TaSiN. The refractory metal may also be selected from the group of elements consisting of Nb, V, W and Ti. In a typical refractory metal-silicon-nitrogen composition of TaSiN, the composition may contain between about 5 at. % and about 55 at. % Ta, between about 10 at. % and about 45 at. % Si, and between about 30 at. % and about 80 at. % N. The semiconductor structure wherein the capacitor is formed may also include a conductive element used to establish electrical connection with the capacitor. The conductive element may be formed of doped polysilicon, metal silicide, polycide, refractory metal, aluminum, copper and alloys thereof.

The refractory metal-silicon-nitrogen films, such as TaSiN, have the advantage of being either insulating or resistive depending on the ratio of refractory metal to the silicon to the nitrogen. The films are thermally stable to annealing at temperature up to 800° C.

The present invention novel method can further be used to fabricate a modulated RC stack structure by modulating the mixture of nitrogen to argon during a sputtering deposition process.

The present invention novel method for forming refractory metal-silicon-nitrogen capacitors and the structures formed have therefore been amply described in the above description and in the appended drawings of FIGS. 1–3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a refractory metal-silicon-nitrogen capacitor in a semiconductor structure comprising the steps of:

positioning a preprocessed semiconductor substrate in a sputtering chamber;

flowing Ar gas into said sputtering chamber;

sputter depositing a first refractory metal-silicon nitrogen layer on said substrate;

flowing $N_2$ gas into said sputtering chamber such that concentration of said $N_2$ gas in said chamber is at least 35% by adjusting the flow or partial pressure of $N_2$;

sputter depositing a second refractory metal-silicon-nitrogen layer on top of said first refractory metal-silicon nitrogen layer;

stopping said $N_2$ gas flow into said sputter chamber;

sputter depositing a third refractory metal-silicon-nitrogen layer on top of said second refractory metal-silicon-nitrogen layer; and photolithographically forming said first, second and third refractory metal-silicon-nitrogen layers into a capacitor.

2. A method for forming a refractory metal-silicon-nitrogen capacitor in a semiconductor structure according to claim 1 further comprising the step of in-situ annealing said capacitor at a temperature of at least 80° C.

3. A method for forming a refractory metal-silicon-nitrogen capacitor in a semiconductor structure according to claim 1 further comprising the step of flowing said Ar gas into said sputter chamber at a flow rate between about 10 sccm and about 200 sccm.

4. A method for forming a refractory metal-silicon-nitrogen capacitor in a semiconductor structure according to claim 1 further comprising the step of flowing said $N_2$ gas into said sputter chamber at a flow rate between about 1 sccm and about 100 sccm.

5. A method for forming a refractory metal-silicon-nitrogen capacitor in a semiconductor structure according to claim 1 further comprising the step of sputter depositing said first and said third refractory metal-silicon-nitrogen layer to a thickness of between about 100 Å and about 5000 Å.

6. A method for forming a refractory metal-silicon-nitrogen capacitor in a semiconductor structure according to claim 1 further comprising the step of sputter depositing said second refractory metal-silicon-nitrogen layer to a thickness of between about 100 Å and about 5000 Å.

7. A method for forming a refractory metal-silicon-nitrogen capacitor in a semiconductor structure according to claim 1 further comprising the step of sputter depositing said first and said third refractory metal-silicon-nitrogen layer each having a sheet resistance of not higher than 50 ohm/sq.

8. A method for forming a refractory metal-silicon-nitrogen capacitor in a semiconductor structure according to claim 1 further comprising the step of sputter depositing said second refractory metal-silicon-nitrogen layer which has a dielectric constant greater than 7.5.

9. A method for forming a refractory metal-silicon-nitrogen capacitor in a semiconductor structure according to claim 1 further comprising the step of sputter depositing said first, second and third refractory metal-silicon-nitrogen layers formed of a refractory metal selected from the group consisting of Ta, Nb, V, W and Ti.

10. A method for forming a refractory metal-silicon-nitrogen capacitor in a semiconductor structure according to claim 1 further comprising the step of sputter depositing said first, second and third refractory metal-silicon-nitrogen layers from a sputtering target of refractory metal silicide.

11. A method for forming a refractory metal-silicon-nitrogen capacitor in a semiconductor structure according to claim 1 further comprising the step of sputter depositing said first, second and third refractory metal-silicon-nitrogen layers from two sputtering targets of a refractory metal and a silicon.

* * * * *